United States Patent
Baker et al.

(10) Patent No.: US 10,553,512 B2
(45) Date of Patent: Feb. 4, 2020

(54) HYBRID PARYLENE-METAL OXIDE LAYERS FOR CORROSION RESISTANT COATINGS

(71) Applicant: HZO, Inc., Draper, UT (US)

(72) Inventors: Layton Baker, Draper, UT (US); Sean Clancy, Draper, UT (US); Chien-Lan Hsueh, Draper, UT (US)

(73) Assignee: HzO, Inc., Morrisville, NC (US)

( * ) Notice: Subject to any disclaimer, the term of this patent is extended or adjusted under 35 U.S.C. 154(b) by 241 days.

(21) Appl. No.: 15/347,646

(22) Filed: Nov. 9, 2016

(65) Prior Publication Data

US 2017/0133292 A1   May 11, 2017

Related U.S. Application Data

(60) Provisional application No. 62/253,014, filed on Nov. 9, 2015.

(51) Int. Cl.
*B05D 1/00* (2006.01)
*H01L 23/29* (2006.01)

(52) U.S. Cl.
CPC ............................... *H01L 23/291* (2013.01)

(58) Field of Classification Search
CPC .... B05D 1/00; B05D 1/60; C09D 5/08; C23C 16/403; H05K 3/282; H01L 23/291
See application file for complete search history.

(56) References Cited

U.S. PATENT DOCUMENTS

| | | | | |
|---|---|---|---|---|
| 2002/0182392 A1* | 12/2002 | Welch, Jr. | ................ | B05D 1/60 428/216 |
| 2005/0146267 A1* | 7/2005 | Lee | ........................... | B05D 1/60 313/506 |
| 2010/0072435 A1* | 3/2010 | Honda | ...................... | H01B 1/22 252/519.51 |
| 2010/0132762 A1* | 6/2010 | Graham, Jr. | ......... | C23C 16/0272 136/244 |
| 2010/0260996 A1* | 10/2010 | Chen | ....................... | B32B 27/32 428/220 |
| 2012/0034444 A1* | 2/2012 | Chen | ....................... | B32B 27/32 428/220 |
| 2012/0052681 A1* | 3/2012 | Marsh | ................. | C23C 16/0227 438/680 |
| 2014/0252342 A1* | 9/2014 | Ramadas | ................ | H01L 21/56 257/40 |

\* cited by examiner

*Primary Examiner* — Travis M Figg
(74) *Attorney, Agent, or Firm* — Intellectual Strategies

(57) ABSTRACT

Described herein is a composite coating on a substrate including a parylene layer deposited on a substrate surface of a substrate, a metal oxide layer covering the parylene layer, and a metal oxide, parylene hybrid layer formed between the metal oxide layer and the parylene layer.

20 Claims, 2 Drawing Sheets

HYBRID PARYLENE-METAL OXIDE LAYERS FOR CORROSION RESISTANT COATINGS

CROSS-REFERENCES TO RELATED APPLICATIONS

This application claims the benefit of U.S. Provisional Patent Application No. 62/253,014 entitled "HYBRID PARYLENE-METAL OXIDE LAYERS FOR CORROSION RESISTANT COATINGS" and filed on Nov. 9, 2015 for Layton Baker et al., which is incorporated herein by reference.

TECHNICAL FIELD

This disclosure relates generally to coatings and methods of preparing components within an electronic device with corrosion resistant coatings. More specifically, the disclosed subject matter relates to coatings and methods of preparing electronic components with enhanced parylene coatings to impart the components with resistance to corrosive chemical species.

BACKGROUND

The durability of electronic devices in harsh environmental conditions is of major interest in industrial and consumer electronics. In electronic applications, electronic assemblies are frequently exposed to corrosive environments (e.g., high temperatures, water, steam, acids, organic solvents, salt, etc. and combinations thereof) which can cause rapid failure of electronic components and circuits on the electronics assembly. In consumer electronics, the most common corrosive environmental exposures are accidental water spray or immersion. Electronics are commonly housed within a protective case or enclosure which is designed, in part, to limit exposure of the electronics assembly and components to water and other corrosive solids, liquids, and gases. The protective cases/enclosures typically do not provide complete protection and add volume and mass to electronic products.

An alternative to corrosion-resistant cases arises from encapsulating the underlying electrical components within device enclosures. For example, a thin film or protective coating can be applied to the electronic circuitry and/or components inside of an electronic device. This protective coating fully encapsulates and protects the electronic device from corrosive chemical species, such as water, without requiring a bulky external protective case. Such corrosion-resistant coatings are desirable for protection against incidental or accidental exposure to water and other corrosive species. For instance, a thin film coating may protect the electronic components of a consumer electronics device from corrosion, and eventual failure, due to high humidity, rain, spilled drinks, immersion or even full submersion in water.

There remains, therefore, a need in the art to provide alternative coatings that might be applied to the circuitry and components of an electronic device that offer extended protection from corrosive chemical species exposure, as well resistance to mechanical handling and wear and that might impart additional desirable properties such as electromagnetic resistance, oxidation resistance, or desirable optical properties.

SUMMARY

The subject matter of the present application has been developed in response to the present state of the art, and in particular, in response to the shortcomings of electronic device and substrate coatings, that have not yet been fully solved by currently available techniques. Accordingly, the subject matter of the present application has been developed to provide a composite coating with a metal oxide, parylene hybrid layer to overcome at least some of the above-discussed shortcomings of prior art techniques.

According to one embodiment, a composite coating on a substrate includes a parylene layer on a substrate surface of a substrate, the parylene layer including an outer surface; a metal oxide layer covering the outer surface of the parylene layer, and a metal oxide, parylene hybrid layer located between the metal oxide layer and the parylene layer. In some implementations, metal oxide, the parylene hybrid layer is located within an outer layer of the parylene layer.

In certain implementations of the composite coating, the parylene is selected from parylene A, parylene C, parylene N, parylene D, parylene VT-4, parylene AF-4, as well as mixtures and derivations of the same. In some embodiments, the polymer is selected from parylene C and parylene N.

According to some implementations of the composite coating, the metal oxide layer is formed by oxidation of a metal oxide precursor defined by formula I: $[M]\text{-}(R^1)n$ where M is a metal, each R1 is selected from or is at least one of hydrogen, $C_1\text{-}C_{12}$ alkyl, $C_1\text{-}C_{12}$ alkoxide, halogen, alkyl halide, $C_1\text{-}C_{12}$ alkylamido, di-$C_1\text{-}C_{12}$ alkylamido, optionally substituted cyclopentadienyl, and n corresponds to the oxidation state of the metal.

In some embodiments, the metal is one or more selected from a group including aluminum, gallium, magnesium, hafnium, silicon, tantalum, titanium, yttrium, zinc, and zirconium. In some implementations, the metal is aluminum. In some implementations, the metal is titanium. In some implementations, the metal is zinc. In some implementations, the metal is silicon. In some implementations, the metal is zirconium.

In some embodiments, at least one $R^1$ is hydrogen, $C_1\text{-}C_{12}$ alkyl, or partially or completely halogenated $C_1\text{-}C_{12}$ alkyl. In some embodiments, at least one $R^1$ is a halogen selected from the group consisting of fluorine, chlorine, and bromine, or an alkoxide selected from the group consisting of isopropoxide and butoxide. In some embodiments, at least one $R^1$ is optionally substituted cyclopentadienyl.

In one aspect, a coated corrosive sensitive article is disclosed. The article includes embodiments of the composite coatings disclosed herein.

According to one embodiment, a process for making an article is disclosed. The method includes providing a solid substrate having a substrate surface, applying a parylene layer to the substrate surface, depositing a metal oxide precursor onto a surface of the parylene layer, thereby covering the parylene layer, diffusing the metal oxide precursor into the surface of the parylene layer, and oxidizing the metal oxide precursor to form a metal oxide layer and a metal oxide, parylene hybrid layer between the metal oxide layer and the parylene layer.

In some embodiments, the parylene is selected from parylene A, parylene C, parylene N, parylene D, parylene VT-4, parylene AF-4, as well as mixtures and derivatives of the same.

In some embodiments, the surface of the parylene layer or polymer film is modified by infusion of a metal oxide precursor of the formula I: $[M]\text{-}(R^1)_n$ where M is a metal, each $R^1$ is selected from hydrogen, $C_1\text{-}C_{12}$ alkyl, $C_1\text{-}C_{12}$ alkoxide, halogen, $C_1\text{-}C_{12}$ alkylamido, di-$C_1\text{-}C_{12}$ alkylamido, optionally substituted cyclopentadienyl, and n corresponds to the oxidation state of the metal.

In some embodiments, the metal is selected from or at least one of aluminum, gallium, magnesium, hafnium, silicon, tantalum, titanium, yttrium, zinc, and zirconium.

In some embodiments, the temperature of the diffusion step is in the range of about 20° C. to about 150° C.

In one aspect, an article prepared from the processes disclosed herein is also disclosed.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the present subject matter will be readily understood, a description of the present subject matter will be rendered by reference to specific embodiments that are illustrated in the appended drawings. Understanding that these drawings depict only typical embodiments of the present subject matter and are not therefore to be considered to be limiting of its scope, the present subject matter will be described and explained with detail through the use of the accompanying drawings, in which.

DETAILED DESCRIPTION

Figure 1:
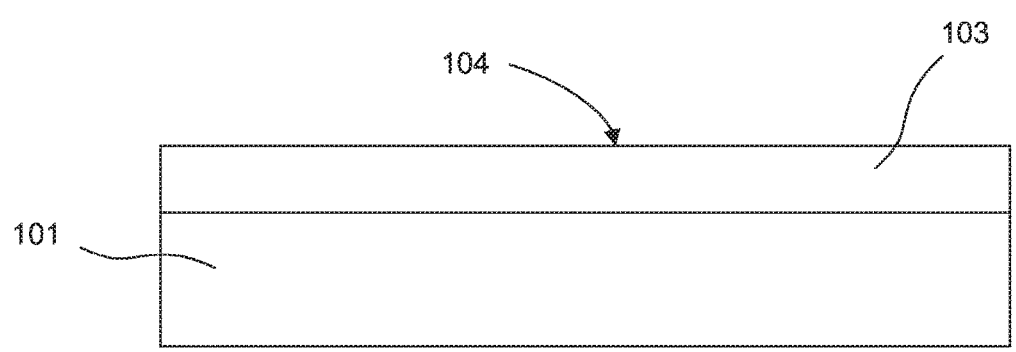
FIG. 1 is a cross-sectional view of a substrate with a parylene coating, according to one or more embodiments of the present disclosure.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings.

The term "corrosion resistant" refers to the ability of a coating to prevent exposure of a coated element or feature to corrosive chemical species. With the context of an electronic device, corrosive chemical species include any chemical, gas, liquid, or solid, which causes or facilitates degradation of materials on the electronic device. Examples of such corrosive chemical species include, but are not limited to, (a) humid warm air, (b) liquid water, (c) salts such as from seas and oceans (e.g., salt water immersion; humid, salty air in coastal environments), (d) organic vapors and liquids such as diesel fuel, jet fuel, gasoline, acetone, alcohols, and mixtures thereof, (e) acids such as aqueous hydrochloric acid or hydrochloric acid vapor, (f) bases such as aqueous ammonia or ammonia vapor, and (g) gaseous corrosive species such as sulfur dioxide and sulfur trioxide, which may adsorb on the surface of electronic components. A corrosion resistant coating may resist wetting or penetration by one or more types of corrosive chemical species, or it may be impermeable or substantially impermeable to one or more types of corrosive chemical species. A corrosion resistant coating may repel one or more types of corrosive chemical species such as salt solutions, acidic solutions, basic solutions, drinks, etc. or vapors of water or other aqueous materials (e.g., humidity, fogs, mists, etc.), wetness, etc. Use of the term "corrosion resistant" to modify the term "coating" should not be considered to limit the scope of materials from which the coating protects one or more components of an electronic device. The term "corrosion resistant" may also refer to the ability of a coating to restrict permeation of or repel organic liquids or vapors (e.g., organic solvents, other organic materials in liquid or vapor form, etc.), as well as a variety of other substances or conditions that might pose a threat to a substrate, such as an electronic device or its components.

As used herein, the terms "composite coating" and "composite-like coating" refer to a combination of layers of parylene material and metal oxide including a near surface region of the parylene material where metal oxide is also present in the parylene material having diffused into the near surface region as a metal oxide precursor which subsequently oxidizes into a metal oxide. The resulting near surface region of the parylene material is a hybrid material made up of parylene polymer and metal oxide.

Coating systems, or, more simply, coatings, for imparting substrates with corrosion resistance are disclosed. Such a coating may be used on any suitable substrate, including, without limitation, components that will reside within the interior of an electronic device.

A composite coating made up of a parylene layer and a metal oxide layer covering a surface of the parylene layer is described herein. Referring to FIG. 1, a cross-sectional view of a substrate 101 with a parylene coating or parylene layer 103 is shown. The parylene coating or parylene layer 103 includes an outer surface 104 (opposite the substrate) onto which a metal oxide precursor may be interspersed which is described in more detail in conjunction with FIGS. 2 and 3.

Figure 2:
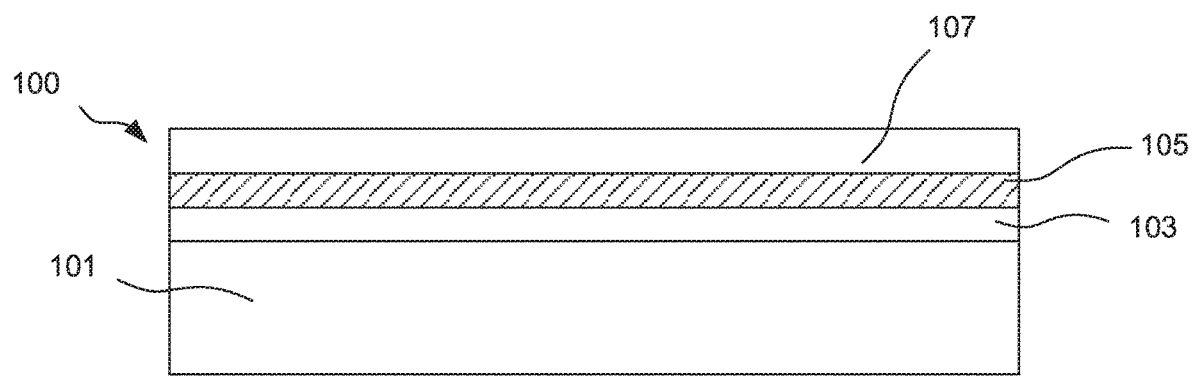
FIG. 2 is a cross-sectional view of a substrate with a composite coating, according to one or more embodiments of the present disclosure.

Referring to FIG. 2, a representative embodiment of the composite coating 100 is shown. The metal oxide layer 107 is derived from a metal oxide precursor that is applied as a layer on the parylene layer 103 and subsequently oxidized to form the metal oxide layer 107. Beneath the metal oxide layer 107 at the interface between the metal oxide layer 107 and the parylene layer 103 is a resulting interspersion or metal oxide, parylene hybrid layer 105 of parylene and metal oxide derived from the infusion of metal oxide precursor that subsequently oxidizes to form metal oxide. The interspersion may also be referred to as a metal-organic hybrid layer or zone in which metal oxide precursor has diffused into the parylene layer 103. The parylene material is adjacent to a substrate 101.

An in situ surface treatment process for producing the composite coating 100 is also described herein. The composite coating 100 covers some or all of a substrate 101, with the substrate 101 disposed beneath the parylene layer 103. Exemplary substrates 101 include components configured to be within an interior of an electronic device, such as a printed circuit board assembly (PCBA). The composite coating 100 with the metal-organic hybrid layer provides enhanced properties, such as, for example, UV blocking, improved oxidation resistance, wear resistance, and water and corrosion resistance, to substrates.

In the composite coating 100, molecules of the metal oxide precursor initially cover the surface of the parylene layer 103 or polymer film. For example, the metal oxide precursor may form a monolayer or multi-layer on the surface of the parylene layer 103 which also fills small voids in the parylene layer 103. The metal oxide precursor also diffuses into the top or near surface portion of the parylene layer 103 forming an interspersion of the metal oxide precursor. Further, the metal oxide precursor subsequently oxidizes in an oxidizing environment (for example, water, air, and/or oxygen) thus forming a metal oxide layer 107 covering the parylene layer 103. Inasmuch as the metal oxide precursor that has interspersed into the organic polymer layer comes into contact with the oxidant source, such as by diffusion, the precursor also oxidizes so that metal oxide is interspersed within the parylene layer 103. The resulting layer, therefore, is a hybrid material of parylene and metal oxide or a metal oxide, parylene hybrid layer 105.

A variety of parylene materials may be used. As generally known in the art, parylene includes a variety of a number of unsubstituted and substituted poly(para-xylylene). Exemplary parylenes include parylene A (amino-modified parylene), parylene C (poly(chloro-p-xylylene)), parylene N (poly(p-xylylene)), parylene D (poly(dichloro-p-xylylene)), parylene F (which can specifically refer to parylene-VT4, parylene-AF4, or any other parylene with a fluorine atom or atoms in the molecular structure), as well as mixtures and/or derivatives thereof.

The metal oxide precursor covers the parylene layer 103. Additionally, a portion of the metal oxide precursor may diffuse into upper or near surface portion of the parylene layer 103. Thus, one of ordinary skill in the art will understand that for the purposes of this application the terms "cover", "covers", and "covering" encompass embodiments where the metal oxide layer 107 forms a layer on top of the parylene layer 103, and into the parylene layer 103 from diffusion into the parylene layer 103, thereby filling in void defects or gaps that may be present in the parylene layer 103.

The metal oxide layer 107 on top of the parylene layer 103 may have a thickness from about 0.1 nm to about 100 nm. In some embodiments, the metal oxide layer 107 is from about 0.1 nm to about 50 nm. In some embodiments, the metal oxide layer 107 from about 0.1 nm to about 20 nm. The metal oxide precursor that diffuses into the parylene layer 103 or polymer film may diffuse to a depth of up to about 500 nm or more into the parylene layer 103. In some embodiments, the metal oxide precursor that diffuses into the parylene layer 103 does so to a depth of up to about 200 nm. In some embodiments, the metal oxide precursor that diffuses into the parylene layer 103 does so to a depth of up to about 100 nm.

The parylene layer 103 may have a thickness from about 0.3 microns ($\mu m$) to about 4 $\mu m$. In some embodiments, the thickness is from about 0.4 $\mu m$ to about 3 $\mu m$. In some embodiments, the thickness is from about 0.5 $\mu m$ to 2 $\mu m$.

The total thickness of the composite coating 100, which includes a parylene layer 103 and a metal oxide layer 107, may be from about 0.3 $\mu m$ to about 4.1 $\mu m$. In some embodiments, the total thickness of the composite coating 100 is from about 0.5 $\mu m$ to about 4 $\mu m$. In some embodiments, the total thickness of the composite coating 100 is from about 0.7 $\mu m$ to about 2 $\mu m$. The total thickness of the composite coating 100 is variable to provide the properties for the underlying substrate 101 and the article in which it is incorporated. Factors such as intended use (e.g., desired barrier properties for a particular use) and manufacturing deposition time may be considered when determining the total thickness for a particular composite coating 100.

Embodiments of the composite coating 100 may have enhanced properties relative to the parylene layer 103 by itself. For example, transmission of water and other molecules through the composite material may be reduced by the metal oxide covering the surface of the parylene layer 103 and depositing into defects, voids, and/or imperfections in the surface of a parylene only coating. Further, any diffused metal oxide precursor into the parylene material and subsequent formation of metal oxide via oxidation will densify or increase the density in the near surface layer of the parylene material, thus also reducing transmission of water and other molecules through the composite material. Further, a metal oxide covering resulting from oxidation of the metal oxide precursor applied to the parylene can provide UV resistance, with some metal oxides potentially providing greater resistance than others. For example, titanium oxide and zinc oxide may provide enhanced UV protection to an underlying parylene layer 103. Additionally, a metal oxide top layer may inhibit degradation of parylene in high temperature oxidative environments (for example, hot air) by providing a diffusion barrier above the parylene layer 103. Further, the composite coating 100 may exhibit improved scratch and wear tolerance. Further, the optical properties of parylene film (for example, transmission and color) can be modified by adjusting the thickness and properties of the metal oxide layer 107. For example, coloring of the parylene layer 103 may help with optical inspection of a coated substrate. Further, covering of the parylene layer 103 with a metal oxide layer 107 may impart novel optical properties to parylene (for example, notch/band-stop/band-pass filter functions). In addition, certain metal oxides may be used to modify the electrical properties of the parylene layer 103. For example, zinc oxide may be used to make the parylene film surface semiconducting for electrostatic discharge (ESD) mitigation issues.

In some embodiments the metal oxide precursor includes both metal-organic and metal-halide chemical species and may be defined by the formula I: $[M]\text{-}(R^1)_n$ where M is a metal, and where each $R^1$ is selected from or at least one of hydrogen, $C_1$-$C_{12}$ alkyl, $C_1$-$C_{12}$ alkoxide, halogen, alkyl halide, $C_1$-$C_{12}$ alkylamido, di-$C_1$-$C_{12}$ alkylamido, optionally substituted cyclopentadienyl, and n corresponds to the oxidation state of the metal. Exemplary halogens may include fluorine, chlorine, or bromine. Exemplary alkoxides may include iso-propoxide or butoxide.

The metal M in formula I can be selected from any non-toxic metal including transition metals and post-transition metals. For example, the metal may be selected one or a combination of the following metals, including aluminum, gallium, magnesium, hafnium, silicon, tantalum, titanium, yttrium, zinc, and zirconium.

Exemplary metal oxide precursors may include the following:

For precursors wherein the metal is aluminum: trimethyl-aluminum, dimethyl-aluminum hydride, triethyl aluminum, aluminum tribromide, aluminum chloride, triisopropyl-aluminum, dimethylaluminum isopropoxide, aluminum sec-butoxide, tris(diethylamido)-aluminum, tris(ethylmethylamido)-aluminum, and diethyl-aluminum ethoxide;

For precursors wherein the metal is gallium: trimethyl gallium, dimethyl-gallium hydride, triethyl-gallium, triisopropyl-gallium, gallium tribromide, gallium trichloride, tris(dimethylamido)gallium, and tri-tert-butyl-gallium;

For precursors wherein the metal is magnesium, magnesium chloride, bis(cyclopentadienyl)magnesium, bis(ethylcyclopentadienyl)magnesium, bis(pentaethylcyclopentadienyl)magnesium, bis(pentamethylcyclopentadienyl) magnesium, bis(n-propylcyclopentadienyl)magnesium, and bis(2,2,6,6-tetramethyl-3,5-heptanedionato)magnesium;

For precursors wherein the metal is hafnium, hafnium chloride, hafnium tert-butoxide, tetrakis(ethylmethylamido) hafnium, and tetrakis(diethylamido)hafnium, tetrakis(dimethylamido)hafnium;

For precursors wherein the metal is silicon, silane, disilane, trisilane, tetramethylsilane, trimethylsilane, tetradeuterosilane (silane-d4), silicon chloride, bis(tertiary-butylamino)silane (BTBAS), bis(diethylamino)silane (BDEAS), tetratetraethoxysilane (TEOS), tetramethylcyclotetrasiloxane, dimethoxydimethylsilane, octamethylcyclotetrasiloxane, tris(isoproxy)silanol, tris(tert-butoxy)silanol, and tris (tert-pentoxy) silanol;

For precursors wherein the metal is tantalum, tantalum ethoxide, tantalum butoxide, tantalum methoxide, and pentakis(dimethylamino)tantalum;

For precursors wherein the metal is titanium, titanium chloride, titanium ethoxide, titanium isoproxide, titanium butoxide, tetrakis(dimethylamino)titanium, and tetrakis(diethylamino)titanium;

For precursors wherein the metal is yttrium, tris(R'-cyclopentadienyl)yttrium [where R'=none, methyl, ethyl, propyl, butyl], yttrium hexafluoroacetylacetonate, and tris (2,2,6,6-tetramethyl-3,5-heptanedionato)yttrium;

For precursors wherein the metal is zinc, diethyl zinc, dimethyl zinc, and bis(2,2,6,6-tetramethyl-3,5-heptanedionato)zinc; and For precursors wherein the metal is zirconium, zirconium chloride, zirconium ethoxide, zirconium tert-butoxide, tetrakis(dimethylamino)zirconium, tetrakis(diethylamino)zirconium, tetrakis(methylethylamino)zirconium, zirconium hexafluoroacetylacetonate, zirconium trifluoroacetylacetonate, tetrakis(2,2,6,6-tetramethyl-3.5-heptanedionato)zirconium, and bis(cyclopentadienyl)dimethylzirconium.

As mentioned above, the composite coating 100 may cover a substrate, with the substrate 101 disposed beneath and in contact with the first parylene layer 103 or polymer film. Exemplary substrates 101 may include components configured to be within an interior of an electronic device, such as within the interior of housing for the device. For example, the substrate 101 may be a printed circuit board assembly or PCBA. In other embodiments, the composite coating 100 may cover at least some components that are exposed to the outside of the electronic device. Exemplary substrates 101 may also include a component of a mobile electronic device, an energy storage device such as a battery, an industrial device, a vehicular device, a precision mechanical device, a medical device, a scientific instrument, an article of clothing or the like. A substrate 101 that has been coated with the composite coating 100 described herein may be referred to as a coated article. Although shown as a layer, in some embodiments, the composite coating 100 may fully or partially encapsulate the substrate 101.

Methods for applying the composite coating 100 to a substrate 101 to produce a coated article are described. The layers of the composite coating 100 may be applied in a single process or in two or more processes wherein different materials are applied to a substrate 101. As will be discussed in greater detail below, it is desirable to reduce or eliminate the presence of air and other oxidants during the coating process.

Figure 3:
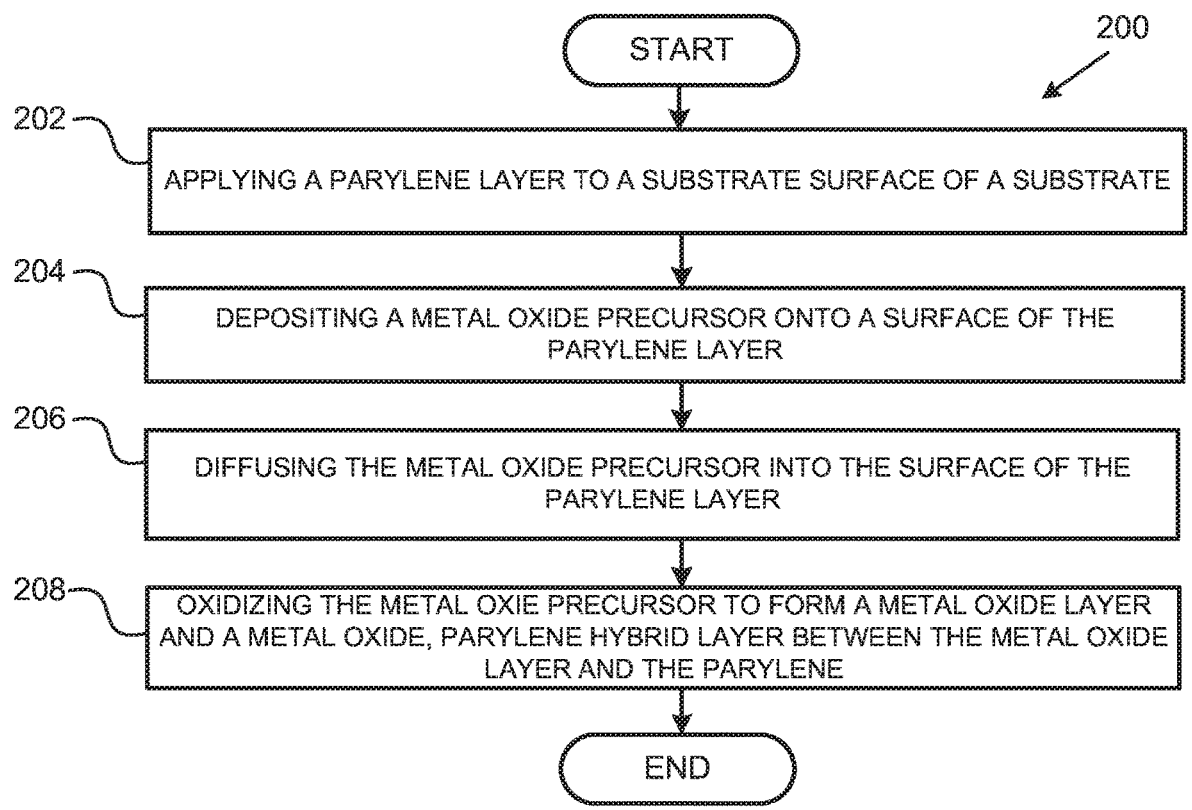
FIG. 3 is a schematic diagram of a process for depositing a composite coating on a substrate, according to one or more embodiments of the present disclosure.

Referring to FIG. 3, a schematic diagram of a process 200 for depositing a composite coating on a substrate is shown. The process 200 includes applying 202 a parylene layer to a substrate surface of a substrate. The process 200 includes depositing 204 a metal oxide precursor onto a surface of the parylene layer, thereby covering the parylene layer. The process 200 further includes diffusing 206 the metal oxide precursor into the surface of the parylene layer. The process 200 includes oxidizing 208 the metal oxide precursor to form a metal oxide layer and a metal oxide, parylene hybrid layer between the metal oxide layer and the parylene layer. The depicted process 200 then ends.

In some embodiments, the discrete processes may be carried out by the same equipment, even in the same application zone (e.g., deposition chamber, etc.), or by separate pieces of equipment (e.g., a chemical vapor deposition (CVD) chamber for parylene and an atomic layer deposition (ALD) chamber for the metal oxide precursor).

In an exemplary embodiment, a parylene layer 103 is deposited on a substrate 101 by chemical vapor deposition. The chemical vapor deposition process includes three major steps: vaporization, pyrolysis, and polymerization. The parameters of each stage can be determined for each material or combination of materials. For example, the vaporizer may operate in a temperature range of 120-170° C., the pyrolysis furnace may operate at a temperature range of about 550-650° C., and the deposition chamber may operate at a temperature range of about 20-150° C.

In an exemplary embodiment of a parylene-C deposition process, the vaporizer temperature is controlled between 150° C. to 165° C. to produce a consistent vapor pressure of dimer in the range of 600-800 mTorr, as measured by pressure sensor in the vaporizer section of deposition tool. Dimer vapor flows through the pyrolysis sub-system, which is operated between 580° C. and 610° C., where dimer is thermally cracked into monomer; the precise operating temperature of the pyrolysis sub-system is set dynamically based upon the molecular flow rate of dimer into the pyrolysis sub-system. The molecular flow rate is determined empirically from the absolute pressure of dimer in the vaporizer and the pressure of monomer in the deposition system. Monomer flows from the pyrolysis sub-system into the deposition chamber where parylene is deposited onto all exposed surfaces via an initial nucleation step followed by chain polymerization. The initial surface temperature of electronic parts and chamber surfaces is near ambient temperature at the beginning of the deposition process and slowly increases during the deposition process due to exothermic nature of parylene chain polymerization.

The metal oxide precursor, for example trimethyl aluminum, can then be exposed to the parylene layer 103. It is desirable that the metal oxide precursor layer forms a monolayer or multilayer on the parylene top surface and also diffuses into the bulk of the parylene film in the upper portion of the parylene layer 103. The metal oxide precursor layer may also fill micro porous structures, voids, defects, and the like in and on the parylene layer 103.

An exemplary embodiment of a metal precursor exposure process is described as follows. After the completion of the parylene deposition process, the deposition chamber is evacuated to base pressure (approximately 1-20 mTorr) and then isolated from the pyrolysis/vaporizer sub-systems and the vacuum pump by closing isolation valves. Trimethyl aluminum is then dosed into the chamber to total pressure of 500-3000 mTorr, 800-1000 mTorr being optimal, and held in the deposition chamber for 1-20 minutes at temperature of 30° C. to 40° C. The total exposure time is dependent upon the parylene film thickness and the desired depth of infusion of metal precursor. For a 1 micron thick parylene-C film, a 1000 mTorr exposure of trimethyl aluminum for 5-10 minutes is sufficient to infuse trimethyl aluminum 100 nm or more into the parylene film. After completion of the exposure time, the deposition system is pumped to base pressure to evacuate trimethyl aluminum vapor. Optionally, the deposition may be purged or pump/purged with inert gas, such as nitrogen or argon, to aid in trimethyl aluminum removal from the deposition chamber. After removal of trimethyl aluminum, water is dosed into the deposition chamber either by dosing pure water vapor into to deposition chamber or by venting the deposition chamber to atmosphere using filter ambient air, which contains a significant partial pressure of water. The water dosed into the deposition chamber will adsorb onto all exposed surfaces, will diffuse into the parylene film and react with trimethyl aluminum, forming aluminum oxide ($Al_xO_y$) both within and on top of the parylene film. Specifically, water reacts with the aluminum-methyl bond to produce an aluminum-oxygen bond, releasing methane in the process. The stoichiometric reaction is as follows:

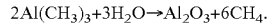

$$2Al(CH_3)_3 + 3H_2O \rightarrow Al_2O_3 + 6CH_4.$$

Diffusion, or interspersion, of the metal oxide precursor into and on the parylene layer 103 may be controlled by varying the exposure time, process temperature (the rate of diffusion at 100° C. is higher than the rate of diffusion at 20° C.), and partial pressure of precursor vapor in the head space "above" the parylene layer 103.

Diffusion, or interspersion, of the metal oxide precursor into and on the parylene layer 103 may be controlled by varying the exposure time, process temperature (the rate of diffusion at 100° C. is higher than the rate of diffusion at 20° C.), and partial pressure of precursor vapor in the head space "above" the parylene layer 103.

In some embodiments, oxidation of the metal oxide precursor may not take place during manufacture of the composite coating 100; however, one of ordinary skill in the art will understand that the metal oxide precursor layer is the outermost layer of the composite coating 100, that layer will oxidize once a substrate 101 covered with the composite coating 100 is brought into contact with an oxidant source such as air. That is, once the composite coated substrate 101 is removed from the reactor/deposition system, it will be exposed to air, which will completely oxidize the metal oxide precursor in the metal-organic hybrid parylene film over time.

In some embodiments, an oxidant is introduced into a reaction chamber after the metal oxide precursor has been exposed to the parylene layer 103. Thus, a metal oxide layer 107 or film will form on the parylene film during the manufacture of the composite coating 100.

In some embodiments, a coating method may also include the application of a mask to selected regions of the substrate 101 to prevent at least one portion of the coating from being applied to those portions. In embodiments where discrete processes are used to form different portions of a coating, the mask may be present while at least one portion of the coating is applied to the substrate, but absent while at least one other portion of the coating is applied to the substrate; thus, some (masked) portions of the substrate 101 will be covered by fewer portions of a coating than other (unmasked) portions of the substrate. In other embodiments, a mask may remain in place as all portions of a coating are applied to the substrate. As a result, the corrosion resistant coating will not cover those areas of the substrate.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive.

What is claimed:

1. A composite coating on a substrate, comprising:
   a parylene layer deposited on a substrate surface of a substrate;
   a metal oxide layer covering the parylene layer; and
   a metal oxide, parylene hybrid layer formed between the metal oxide layer and the parylene layer, wherein a portion of the hybrid layer is located within an outer layer portion of the parylene layer, wherein the hybrid layer diffuses into the outer layer portion to at least a depth of one hundred nanometers in at least one location of the outer layer portion.

2. The composite coating of claim 1, wherein the parylene layer is at least one of parylene A, parylene C, parylene N, parylene D, parylene VT-4, parylene AF-4, or mixtures or derivations of parylene A, parylene C, parylene N, parylene D, parylene VT-4, parylene AF-4.

3. The composite coating of claim 1, wherein the parylene layer is at least one of parylene C and parylene N.

4. The composite coating of claim 1, wherein the metal oxide layer is formed by oxidation of a metal oxide precursor defined by formula I: $[M]-(R^1)_n$, wherein:
   M is a metal;
   each $R^1$ is at least one of hydrogen, $C_1$-$C_{12}$ alkyl, $C_1$-$C_{12}$ alkoxide, halogen, $C_1$-$C_{12}$ alkylamido, di-$C_1$-$C_{12}$ alkylamido, optionally substituted cyclopentadienyl; and
   n corresponds to the oxidation state of the metal.

5. The composite coating of claim 4, wherein the metal is at least one of aluminum, gallium, magnesium, hafnium, silicon, tantalum, titanium, yttrium, zinc, and zirconium.

6. The composite coating of claim 4, wherein the metal is aluminum.

7. The composite coating of claim 4, wherein the metal is titanium.

8. The composite coating of claim 4, wherein the metal is zinc.

9. The composite coating of claim 4, wherein the metal is silicon.

10. The composite coating of claim 4, wherein the metal is zirconium.

11. The composite coating of claim 5, wherein at least one least one $R^1$ is hydrogen, $C_1$-$C_{12}$ alkyl, or partially or completely halogenated $C_1$-$C_{12}$ alkyl.

12. The composite coating of claim 5, wherein at least one $R^1$ is a halogen selected from the group consisting of fluorine, chlorine, and bromine, or an alkoxide selected from the group consisting of iso-propoxide and butoxide.

13. The composite coating of claim 5, wherein at least one $R^1$ is optionally substituted cyclopentadienyl.

14. A coated corrosive sensitive article comprising:
   a corrosive sensitive article comprising a substrate surface; and
   a composite coating comprising:
      a parylene layer on the substrate surface;
      a metal oxide layer covering the parylene layer; and
      a metal oxide, parylene hybrid layer formed between the metal oxide layer and the parylene layer, wherein a portion of the hybrid layer is located within an outer layer portion of the parylene layer, wherein the hybrid layer diffuses into the outer layer portion to at least a depth of one hundred nanometers in at least one location of the outer layer portion.

15. The coated corrosive sensitive article of claim 14, wherein the parylene layer is at least one of parylene A, parylene C, parylene N, parylene D, parylene VT-4, parylene AF-4, or mixtures or derivations of parylene A, parylene C, parylene N, parylene D, parylene VT-4, parylene AF-4.

16. A process for depositing a composite coating on a substrate, comprising:
   applying a parylene layer to a substrate surface of a substrate;
   depositing a metal oxide precursor onto a surface of the parylene layer, thereby covering the parylene layer;
   diffusing the metal oxide precursor into an outer layer portion of the parylene layer; and
   oxidizing the metal oxide precursor to form a metal oxide layer, parylene hybrid layer between the metal oxide layer and the parylene layer; wherein the hybrid layer diffuses into the outer layer portion to at least a depth of one hundred nanometers in at least one location of the outer layer portion.

17. The process of claim 16, wherein the parylene layer is at least one of parylene A, parylene C, parylene N, parylene D, parylene VT-4, parylene AF-4, or mixtures or derivations of parylene A, parylene C, parylene N, parylene D, parylene VT-4, parylene AF-4.

18. The process of claim 17, wherein a surface of the parylene layer is modified by infusion of a metal oxide precursor of the formula I: $[M]-(R^1)_n$ wherein:
   M is a metal;

each $R^1$ is at least one of hydrogen, $C_1$-$C_{12}$ alkyl, $C_1$-$C_{12}$ alkoxide, halogen, $C_1$-$C_{12}$ alkylamido, di-$C_1$-$C_{12}$ alkylamido, optionally substituted cyclopentadienyl; and n corresponds to the oxidation state of the metal.

19. The process of claim 16, wherein the metal is at least one of aluminum, gallium, magnesium, hafnium, silicon, tantalum, titanium, yttrium, zinc, and zirconium.

20. The process of claim 16, wherein the diffusing occurs at a temperature in the range of 20° C. to about 150° C.

* * * * *